(12) United States Patent
Usui et al.

(10) Patent No.: US 7,296,343 B2
(45) Date of Patent: Nov. 20, 2007

(54) ELECTRONIC COMPONENT MOUNTING APPARATUS

(75) Inventors: Yoshinao Usui, Tatebayashi (JP); Akihiro Kawai, Isesaki (JP); Manabu Okamoto, Isesaki (JP)

(73) Assignees: Sanyo Electric Co., Ltd., Osaka (JP); Sanyo High Technology Co., Ltd., Gunma (JP)

( * ) Notice: Subject to any disclaimer, the term of this patent is extended or adjusted under 35 U.S.C. 154(b) by 414 days.

(21) Appl. No.: 10/259,783

(22) Filed: Sep. 30, 2002

(65) Prior Publication Data
US 2003/0093896 A1 May 22, 2003

(30) Foreign Application Priority Data
Sep. 28, 2001 (JP) ............................ 2001-301258

(51) Int. Cl.
*B23P 19/00* (2006.01)
(52) U.S. Cl. .............................. 29/740; 29/721; 29/739; 29/833; 29/834
(58) Field of Classification Search .................. 29/833, 29/721, 834, 739, 740
See application file for complete search history.

(56) References Cited

U.S. PATENT DOCUMENTS 5,787,577 A * 8/1998 Kent ............................ 29/833
6,128,074 A * 10/2000 Hong et al. ............... 356/237.1
6,178,626 B1 * 1/2001 Hada et al. .................... 29/833

FOREIGN PATENT DOCUMENTS

| EP | 0652699 A | 5/1995 |
| JP | 63-249018 A | 10/1988 |
| JP | 9-307292 A | 11/1997 |

* cited by examiner

*Primary Examiner*—Rick K Chang
(74) *Attorney, Agent, or Firm*—Morrison & Foerster LLP (57) ABSTRACT

An electronic component mounting apparatus enables a reliable decision of abnormal suction of a component even when the difference between the width and the height of the component is small. When the difference between the thickness of the electronic component detected by a sensor and the data on the thickness stored in the RAM is within the tolerance, a CPU judges that the component is held by a suction nozzle in a normal posture and executes a normal processing control. Then an image of the electronic component is captured by a recognition camera, and a recognition processing is made by an image processing unit to measure the geometry of the component. The CPU, then, judges whether the size of the component is within tolerance or not. When both X-dimension and Y-dimension of the component measured by the image processing unit are within the tolerance, the Y-dimension measured by the image processing unit and the thickness detected by the sensor are compared and the component is judged normal when the Y-dimension is larger.

3 Claims, 9 Drawing Sheets

| Component Type : AAAAA | |
|---|---|
| Thickness | : 0.6 mm |
| X-Size | : 1.6 mm |
| Y-Size | : 0.75mm |
| Tolerance of Thickness | : 0.1 mm |
| Tolerance of X-Size | : 0.1 mm |
| Tolerance of Y-Size | : 0.1 mm |
| Nozzle Level | : 5.0 mm |

FIG.5

| Component Type : BBBBB | |
|---|---|
| Thickness | : 2.0 mm |
| X-Size | : 12.0 mm |
| Y-Size | : 6.0 mm |
| Tolerance of Thickness | : 0.2 mm |
| Tolerance of X-Size | : 0.1 mm |
| Tolerance of Y-Size | : 0.3 mm |
| Nozzle Level | : 5.0 mm |

FIG.6

Component Type : CCCCC

| | |
|---|---|
| Thickness | : 4.5 mm |
| X-Size | : 6.0 mm |
| Y-Size | : 6.0 mm |
| Lead Length | : 2.0 mm |
| Tolerance of Thickness | : 0.4 mm |
| Tolerance of X-Size | : 0.1 mm |
| Tolerance of Y-Size | : 0.3 mm |
| Tolerance of Lead Length | : 0.2 mm |
| Nozzle Level | : 5.0 mm |

_ELECTRONIC COMPONENT MOUNTING APPARATUS_

BACKGROUND OF THE INVENTION

1. Field of the Invention

This invention relates to an electronic component mounting apparatus, specifically to an automatic electronic component mounting apparatus which takes out an electronic component from a component supply with a suction nozzle attached to a carrier head, recognizes the component to adjust the position of the component based on an image captured by a component recognition camera, and mounts the component on a printed circuit board.

2. Description of the Related Art

An electronic component mounting apparatus of prior art measures a level of a bottom surface of an electronic component picked up with a suction nozzle using a line sensor in order to detect an posture of the component held by the nozzle, compares the result with dimensional data of the component, and makes a decision of abnormal suction, in which the component is sucked in a wrong posture, when the result exceeds a certain level.

However, the decision of the abnormal suction is difficult for a minute component, especially when difference between the width and height of the component is small.

When the line sensor cannot make the decision, component recognition by capturing an image of the component with a component recognition camera is needed. Although the component recognition camera is higher in resolution and accuracy than the line sensor, and the decision by component recognition is reliable because the decision is made based on two dimensional information, there still is a possibility of the similar problem as described above.

This invention is directed to a mounting apparatus which enables a decision of abnormal suction of the component even when the difference between the width and height of the component is small.

SUMMARY OF THE INVENTION

A first aspect of this invention is providing an electronic component mounting apparatus which takes out an electronic component from a component supply with a suction nozzle attached to a mounting head, captures an image of the component held by the suction nozzle with a component, recognition camera to recognize the component for recognition processing by a position recognition sensor, adjusts the position of the component based on the recognition processing, and mounts the component on a printed circuit board. The apparatus has a memory to memorize information on dimensions of each type of the electronic components, a CPU to detect thickness of the electronic component at the nozzle based on the output from a sensor set on the path of the mounting head, an image processing unit to measure the dimensions of the electronic component based on the image captured by the component recognition camera, and a CPU to make a decision whether the posture of the component at the nozzle is normal or abnormal based on the dimensions of the component measured by the image processing unit and thickness detected by the CPU to detect thickness.

A second aspect of this invention is providing an electronic component mounting apparatus which takes out an electronic component from a component supply with a suction nozzle attached to a mounting head, captures an image of the component held by the suction nozzle with a component recognition camera to recognize the component for recognition processing by a position recognition sensor, adjusts the position of the component based on the recognition processing, and mounts the component on a printed circuit board. The apparatus has a memory to memorize information on dimensions of each type of the electronic components, a CPU to detect a bottom edge position of the electronic component at the nozzle based on the output from a sensor set on the path of the mounting head, a CPU to judge whether an posture of the electronic component held by the suction nozzle is normal or abnormal based on the bottom edge position detected by the CPU to detect the bottom edge position and the information on the dimensions of the component memorized in the memory, an image processing unit to measure the dimensions of the electronic component based on the image captured by the component recognition camera when the CPU judges the posture of the electronic component normal, and a CPU to judge whether the posture of the electronic component held by the suction nozzle is normal or abnormal based on the dimensions of the component and the bottom edge position detected by the CPU to detect the bottom edge position when the dimensions of the electronic component measured by the image processing unit is within the tolerance.

DETAILED DESCRIPTION OF THE INVENTION

An embodiment of this invention will be described hereinafter.

Figure 2:
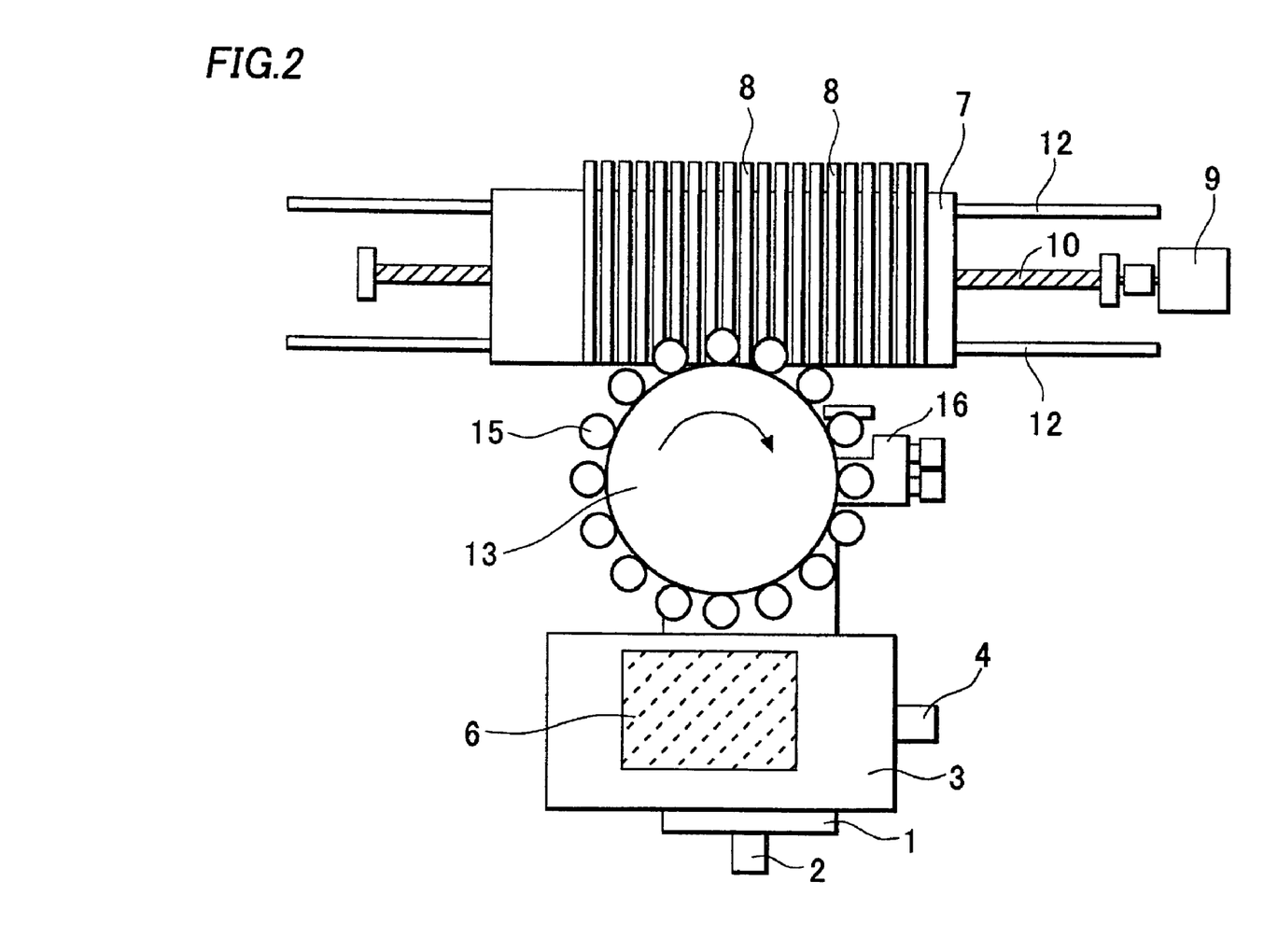
FIG. 2 is a top view of an automatic electronic component mounting apparatus.
Figure 3:
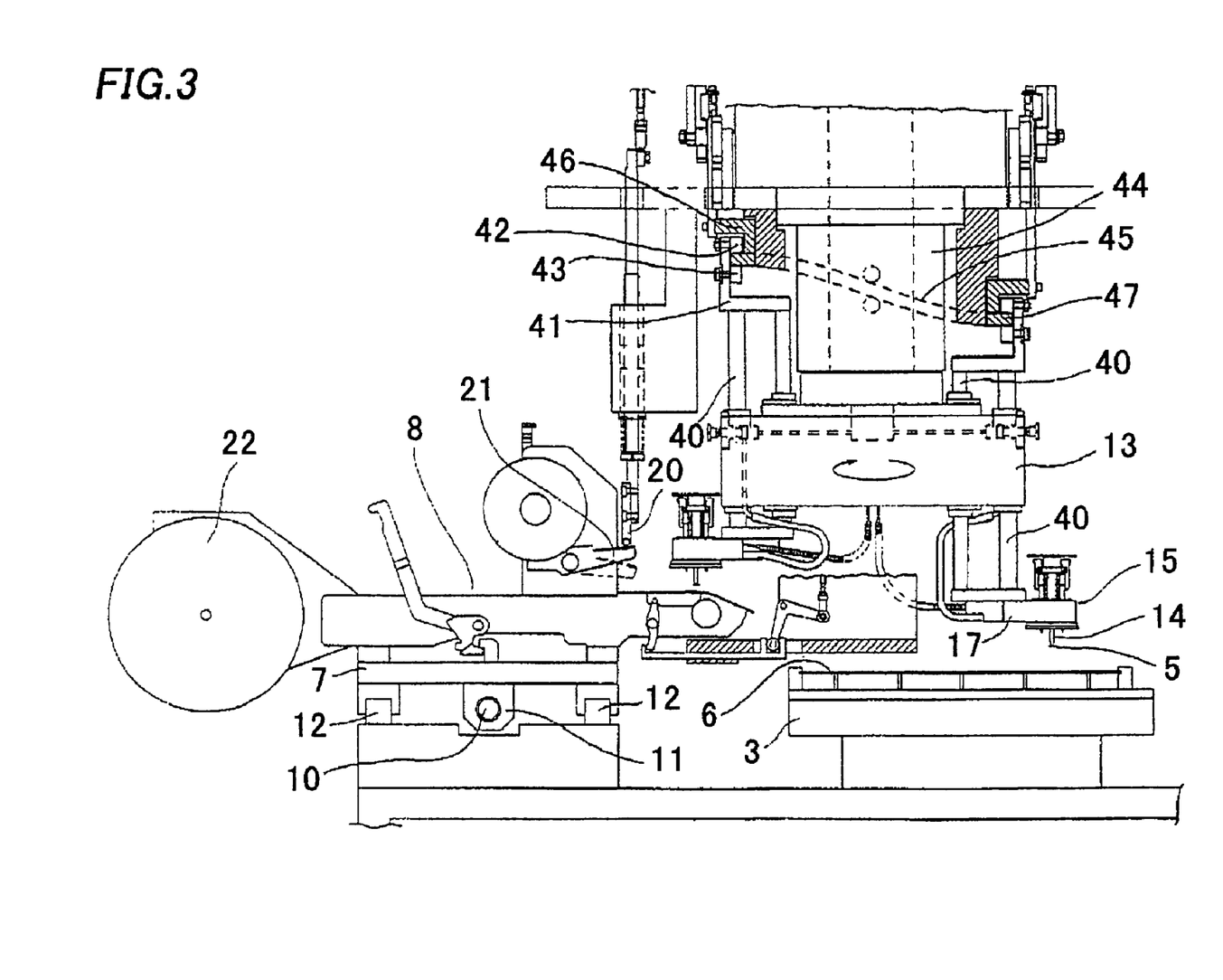
FIG. 3 is a side view with a partial cross-sectional view of the electronic component mounting apparatus of FIG. 2.

FIG. 2 and FIG. 3 show a Y-table 1 which moves in Y-direction driven by a Y-axis motor 2, an XY-table 3 which moves in X-direction driven by an X-axis motor 4 on the Y-table, therefore moves both in X and Y-directions, and a printed circuit board 6, to which a chip electronic component 5 (hereafter referred to as a chip component or a component) is to be attached, mounted on the XY-table with a fixing means which is not shown in the figure.

A multitude of component supply apparatuses 8 to supply the chip component 5 are disposed on a supply stage 7. A supply stage drive motor 9 turns a ball screw 10 which fits into a nut 11 fixed to the supply stage 7 and makes the supply stage 7 move in X-direction guided by a linear guide 12. Mounting heads 15 as carrier heads are disposed with six suction nozzles 14 for taking out nozzles are disposed on an outer edge of a rotary table 13, which rotates intermittently, at regular intervals aligned with a pitch of the intermittence.

The mounting head 15 stops at a suction station, where the suction nozzle 14 sucks up the component 5 from the component supply apparatus 8. A recognition camera 16 is disposed at a recognition station and captures an image of the electronic component 5 at the suction nozzle 14. The image captured by the recognition camera 16 is processed by an image processing unit 18 to recognize a displacement of the electronic component 5.

After the recognition station, the mounting head stops at an angle adjustment station, where the mounting head 15 is turned by a head rotation apparatus 17 in θ direction by an amount of angle that is an amount of angle to correct an angular displacement of the chip component 5 by a recognition result of the image processing unit 18 added to an amount of angle shown in a mounting data, which is not shown in the figure. A second stop position after the angle adjustment station is a mounting station where the electronic component 5 at the suction nozzle 14 is mounted on the substrate 6.

The mounting head 15 is attached to a bottom of a head up-and-down shaft 40 which penetrate the rotary table 13 at both inside and outside and movable upward and downward, and a top of the shaft 40 is fixed to an L-shaped roller mount 41. An upper cam follower 42 and a lower cam follower 43 are held pivotable on and inward the mount 41.

A holding stage 44 is under the rotary table 13 and holds it pivotable horizontally. A cylindrical cam 45 is formed around the holding stage 44. The mounting head 15 moves as the rotary table 13 rotates, while being held by the cylindrical cam 45 which is sandwiched between the upper cam follower 42 and the lower cam follower 43 through a spring (not shown in the figure).

The cylindrical cam 45 is notched at the suction station and the mounting station. The mounting head 15 moves up and down in order to suck or mount the component, as up-and-down moving bodies 46 and 47 move upward and downward driven by a cam, which is not shown, while being sandwiched between the upper cam follower 42 and the lower cam follower 43.

Figure 1:
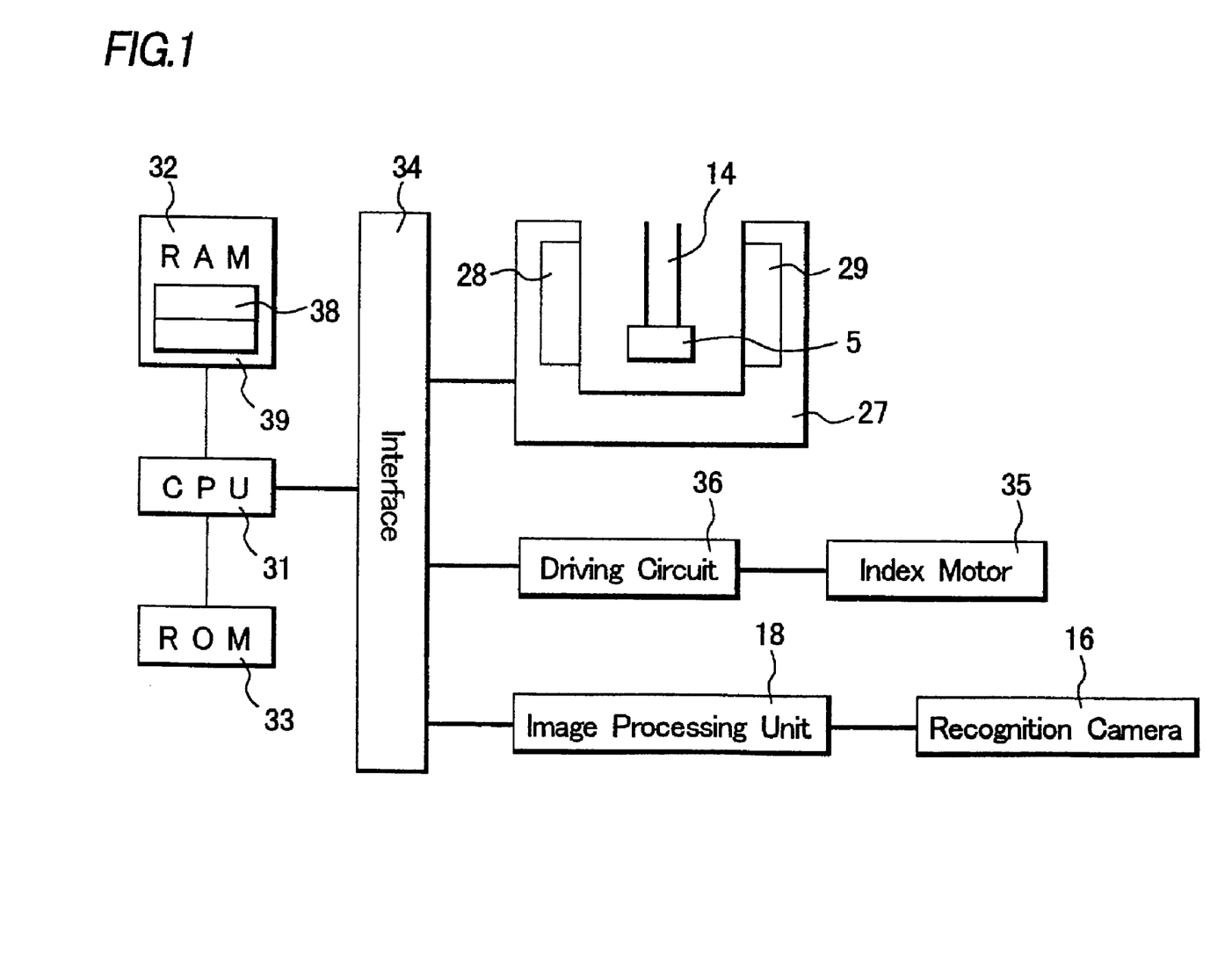
FIG. 1 is a block diagram showing control of an electronic component mounting apparatus of an embodiment of this invention.

An up-and-down rod 20 rocks a rocking lever 21 of the component supply apparatus 8 to send the chip component 5 to a component suction position of the suction nozzle 14, by advancing a component storage tape, which is not shown, storing the chip components 5 at predetermined intervals intermittently aligning with the intervals. A tape reel 22 reels the component storage tape which is not shown. At a second station from the suction station, a line sensor 27 is disposed to detect an posture of the chip component 5 held at the suction nozzle 14, as shown in FIG. 1. The line sensor 27 is composed of a transmitter 28 projecting a light beam horizontally and a receiver 29 consisting of a multitude of CCD elements aligned on a vertical line so that the light beam can be received. The transmitter 28 can use light from an LED and collect it with a condenser lens to transmit a collimated parallel beam, or use light from a laser in the same way. 1000 elements of CCDs aligned within a height of 10 mm is realized. Each of the CCD elements can detect amount of light received, and can be used as an ON/OFF sensor by setting a threshold for the amount of light received. A portion shielded by the component 5 or the suction nozzle 14 can be detected as vertical position data by the ON/OFF outputs.

The line sensor 27 is fixed so that the light beam from the transmitter 28 hits approximately the center of the suction nozzles 14 when the suction nozzle stops as the rotary table 13 stops the rotation.

Next, a control block of the automatic electronic component mounting apparatus of the embodiment will be described referring to FIG. 1.

A CPU 31 works as a central controller and controls various operations related to mounting the chip components 5 based on various data stored in RAM 32 and information from the line sensor 27 and so on, according to a program stored in ROM 33. The line sensor 27 is connected to the CPU 31 through an interface 34. An index motor 35 of the rotary table 13, one of objects controlled by the CPU 31, is connected to the CPU 31 through the interface 34 and a drive circuit 36.

The output of the line sensor 27 is given from each of the CCD elements. CPU 31 calculates a bottom edge position as a lowest edge peak value, that is a vertical position of a boundary between a lowest shielded portion and unshielded portion. The RAM 32 has a read-in memory 38 as a memory means for the bottom edge position on the move and a hold memory 39 as a memory means for the lowest bottom edge position. The read-in memory 38 reads the vertical position of the bottom edge of the component 5 calculated from the output of the line sensor 27 at a regular intervals, i.e., at every move of a certain distance the suction nozzle 14 makes. The hold memory 39 stores the larger value or lower position by comparing the data with the value in the read-in memory 38.

Figure 4:
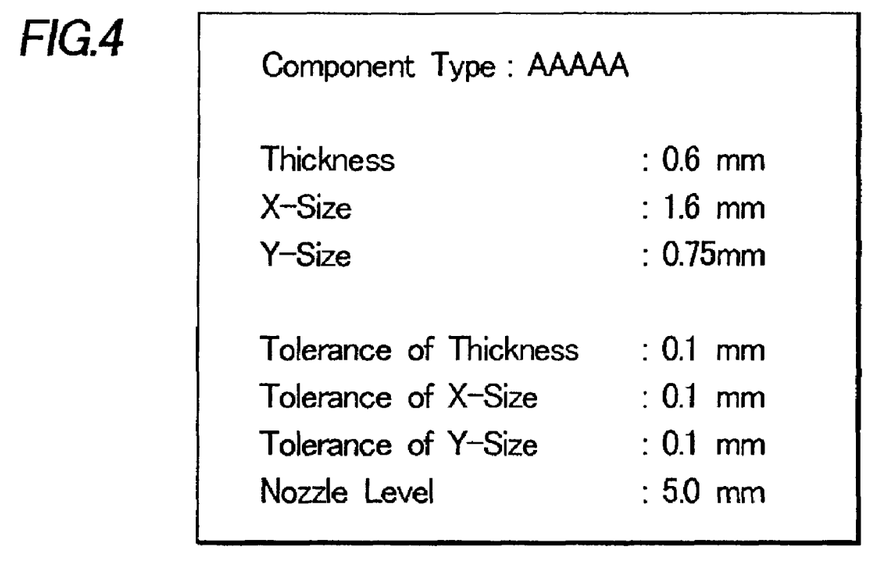
FIG. 4 is a table showing data of a component used in the embodiment.
Figure 5:
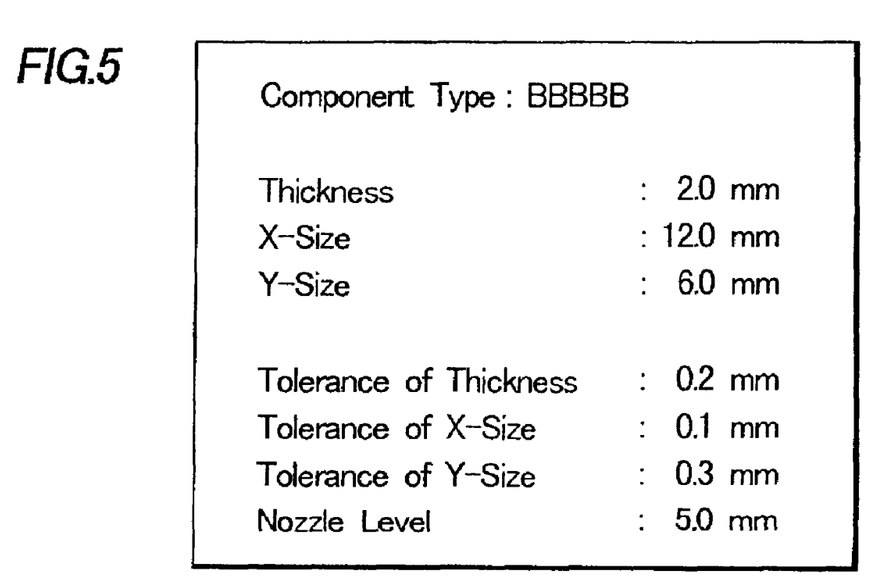
FIG. 5 is a table showing data of another component used in the embodiment.
Figure 6:
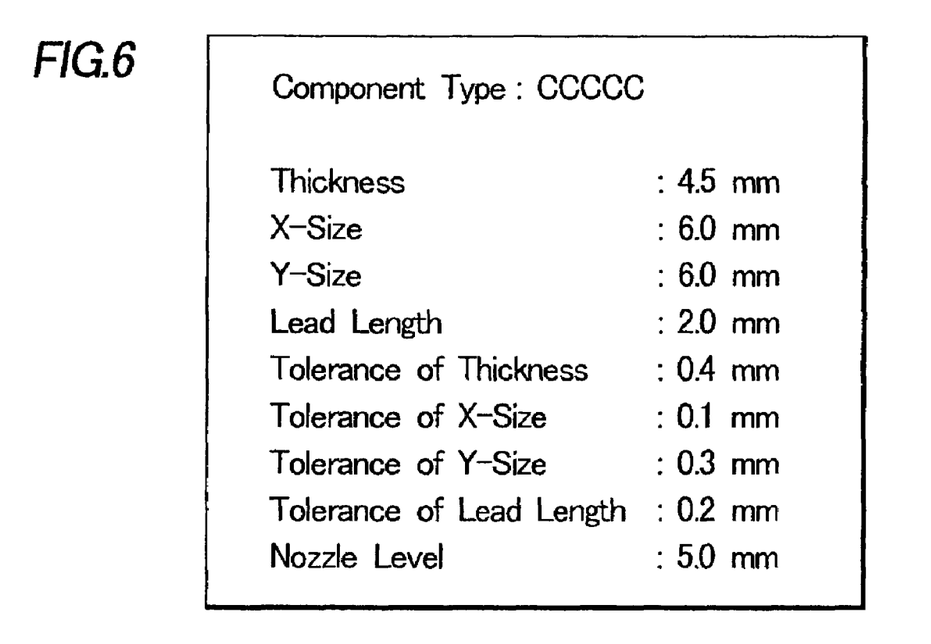
FIG. 6 is a table showing data of another component used in the embodiment.

The RAM 32 also stores data regarding dimensions of each of the components as shown in FIG. 4 through FIG. 6, for example, such as thickness of a component and its tolerance to be referred in comparison with the lowest edge position stored in the hold memory 39.

Operations with the structure described above will be explained hereinafter.

When the automatic operation of the automatic electronic component mounting apparatus is initiated by an operation on a operation unit which is not shown, the supply stage 7 moves and the component supply apparatus 8 stops at a suction position of the suction nozzle 14 at the suction station and the chip component 5 is taken out by a descend of the nozzle 14, according to mounting data on the component 5 stored in the RAM 32 in the order to be mounted, which is not shown.

Figure 7:
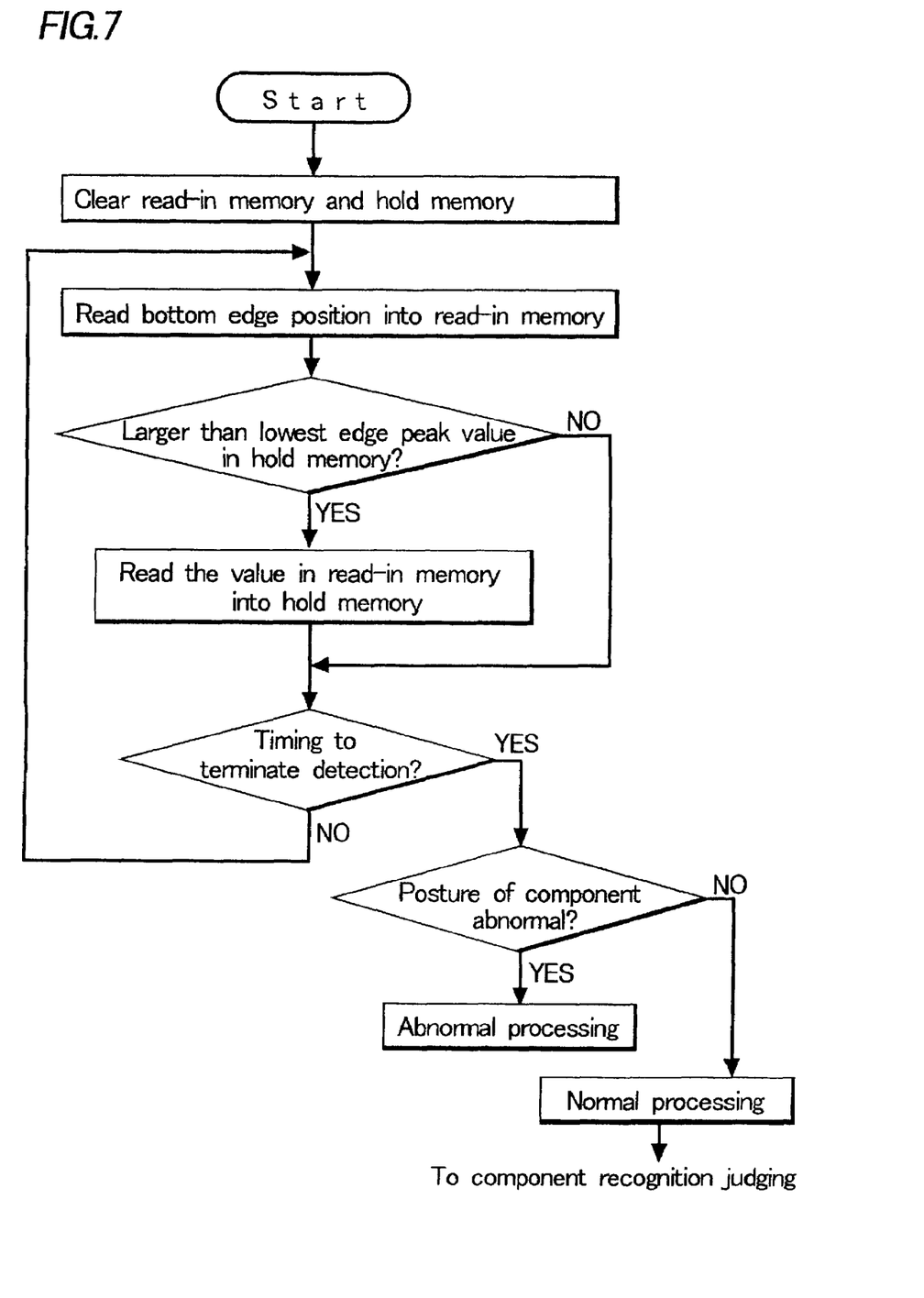
FIG. 7 is a flow chart of posture judgement based on the bottom edge detection.

Next, the rotary table 13 rotates intermittently driven by an index motor 35 through an index mechanism, which is not shown, the head 15 moves to and stops at the next station and with the next rotation further moves to a station where the line sensor 27 is disposed. The CPU 31 detects timing to commence the detection just before the rotary table 13 stops moving, and makes operations shown in a flow chart of FIG. 7. The timing is when the CPU detects that a sensor, which is not shown, is turned ON by detecting a predetermined amount of rotation of a camshaft that goes into a 360-degree roll while the rotary table 13 makes one intermittent rotation. A position of the head 15 at the timing is set to a fixed position so that the detection commences before a front edge of the chip component 5 at the suction nozzle 14 reaches a detection point, i.e., the light beam position taking a displacement in a direction of movement of the largest type of the chip component 5 into consideration. The transmitter 28 of the line sensor 27 always emits the light beam and the receiver 29 is always ready to receive the light beam and provide output. Instead, the transmitter can begin emitting the light beam and the line sensor 27 can begin outputting at the timing to commence the detection. Or the timing to commence the detection and the timing to terminate the detection can be set in a range that allows the detection of up to certain size of the component 5.

At the timing to commence detection, firstly the read-in memory 38 and the hold memory 39 are cleared and the CPU 31 calculates the lowest position of transition from shielded to unshielded from the output of the line sensor 27 as a lowest edge peak value, and stores it in the read-in memory 38. The origin for the value is set above the height of the bottom edge of the suction nozzle 14 and the value is set to increase downward.

Figure 8:
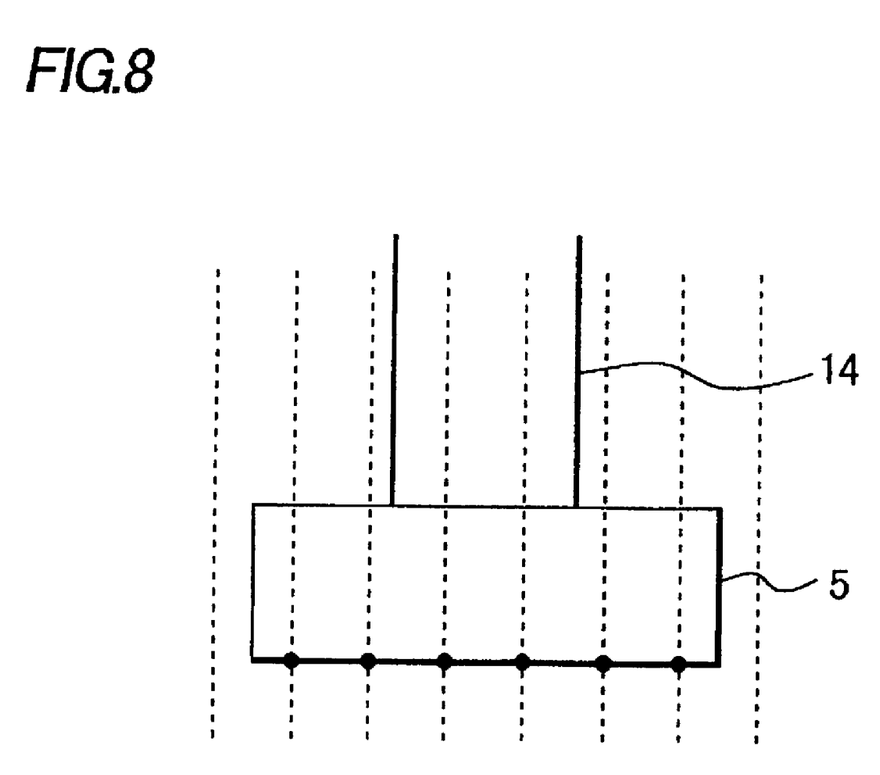
FIG. 8 is a side view showing a chip component held by a suction nozzle.

The CPU compares the value with a value stored in the hold memory 38 and stores larger value in the hold memory 39. It is zero at the beginning since there is no component. The nozzle 14 is moving during the operation, and the CPU repeats the operation because the timing is not a timing to terminate the detection. The CPU 31 reads the output of the line sensor 27 when a portion of the component 5, for example, a portion indicated with the second dashed line from the left in FIG. 8 comes to a position of the light beam from the transmitter 28 of the line sensor 27. A bottom edge position indicated with a black round dot in FIG. 8 is calculated. A value for the position is stored in the read-in memory 38, compared with the value in the hold memory 39, and stored into the hold memory since the value in the read-in memory 38 is larger than the value in the hold memory 39.

Meantime the suction nozzle 14 moves on, and the output of the line sensor 27 for the third dashed line from left in FIG. 8 is read in at next reading time of the CPU 31. This value is larger than the value in the hold memory 39, thus the value in the hold memory 39 is superseded.

The bottom edge position is higher and the value gets smaller for the next read-in position. Therefore the value in the hold memory 39 remains intact. The output of the line sensor 27 is read at each position indicated with each of the dashed lines in FIG. 8. The CPU 31 terminates the read-in when the timing to terminate the detection is detected by a sensor, which is not shown, attached to the camshaft and similar to one described before. When the component is a component described in FIG. 4, the value stored in the hold memory 39, that is for example 5.8 mm, is compared with a sum 5.6 mm of thickness 0.6 mm and a nozzle level 5.0 mm, that is the bottom edge position of the suction nozzle 14, stored in the RAM 32. Since the difference 0.2 mm exceeds the tolerance (±0.1 mm) of the thickness, it is judged abnormal suction (abnormal posture) and followed by an abnormal processing control.

As the abnormal processing, no operation related to component mounting is done when the suction nozzle stops at subsequent station, the chip component is not mounted at a mounting station and is ejected at an assigned ejection station.

Next, when the chip component is sucked in normal posture and carried to the station where the line sensor 27 is disposed, a vertical level of the bottom edge of the component 5 is calculated, read into the read-in memory 38 every time the CPU reads the output of the line sensor 27, and the lowest edge position is stored in the hold memory 39, in the same way as described before. The value stored in the hold memory 39, that is for example 5.55 mm, is compared with the sum 5.6 mm of the thickness 0.6 mm and the nozzle level 5.0 mm that is a bottom edge position of the suction nozzle 14 stored in the RAM 32. Since the difference 0.05 mm is within the tolerance (±0.1 mm) of the thickness, it is judged normal suction (normal posture) and followed by a normal processing control.

After that, an image of the electronic component 5 at the suction nozzle 14 is captured by the recognition camera 16 at the recognition station and recognition processing is performed by the image processing unit 18. That is, the image is captured (image capturing) by the image processing unit 18, geometry of the component is measured, and the measured size of the component (in horizontal direction) is judged whether it is within the tolerance or not.

When the size of the component measured by the image processing unit 18 is 1.7 mm for X-dimension and 0.65 mm for Y-dimension, both are judged within the tolerance as shown in FIG. 4, that is, the X-dimension is within 1.6 mm±0.1 mm and the Y-dimension is within 0.75±0.1 mm. Then the Y-dimension 0.65 mm measured by the image processing unit 18 and the thickness 0.55 mm by the result of the measurement based on the line sensor 27 are compared and the component is judged normal and undergoes normal processing, since the Y-dimension is larger than the thickness. Thus, the mounting head 15 is turned by a head rotation apparatus 17 to adjust the angle of the chip component 5 based on a recognition result of the image processing unit 18 and the chip component 5 is mounted on the printed circuit board 6 placed by the movement of the XY-table 3 at the mounting station. At that time, because the bottom edge position, i.e., the vertical position of the bottom edge of the component 5 is known, a downward stroke of the suction nozzle is adjusted accordingly to the bottom edge position to mount the component 5 on the printed circuit board 6 with an appropriate pressure.

But if the thickness by the result of the measurement based on the line sensor 27 is 0.7 mm and the Y-dimension is 0.65 mm, the component is judged abnormal and undergoes abnormal processing, since the Y-dimension is smaller than the thickness. Therefore the chip component 5 is not mounted on the printed circuit board and ejected at the assigned ejection station. This case is a so-called standing posture sucking and corresponds to a case the chip component 5 is sucked on a side surface rather than on its top surface.

Figure 9:
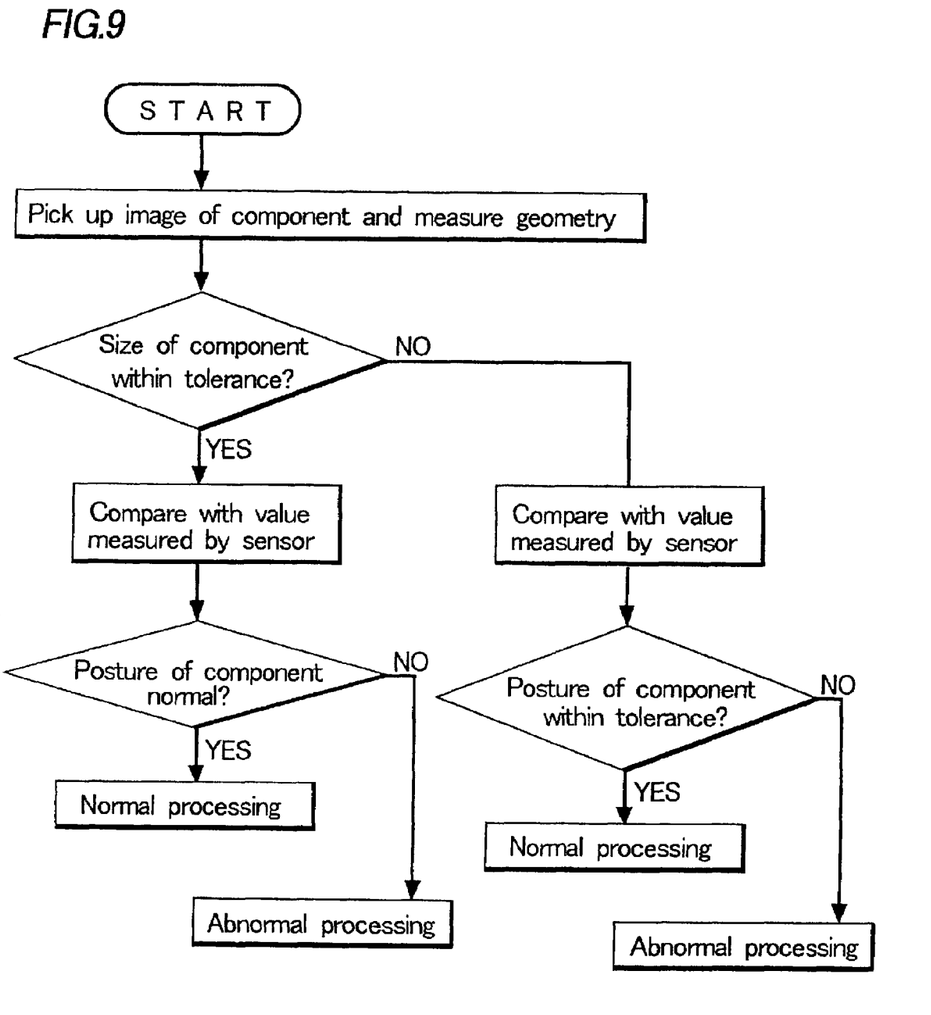
FIG. 9 is a flow chart of posture judgement based on the bottom edge detection and the dimensional measurement of a captured component image.

Next case is for an integrated circuit component (refer to FIG. 10) having component data shown in FIG. 5. The lowest edge position, for example 7.2 mm, stored in the hold memory 39 based on the output of the line sensor is compared with the sum 7.0 mm of the thickness 2.0 mm and the nozzle level 5.0 mm, that is a bottom edge position of the suction nozzle 14, stored in the RAM 32. Since the difference 0.2 mm is within the tolerance of the thickness (±0.2 mm), it is judged normal suction (normal posture) and the CPU 31 makes a normal processing control shown in FIG. 9.

Figure 10:
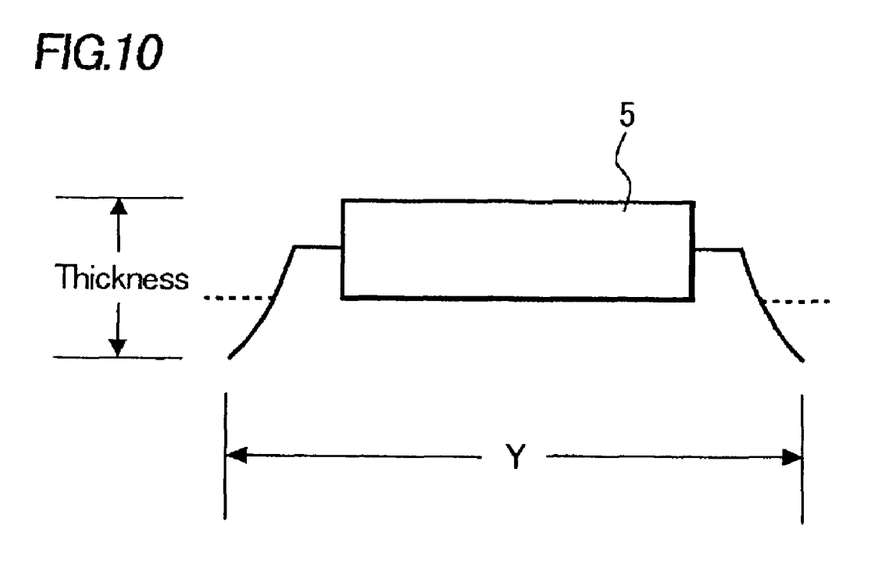
FIG. 10 is a side view of an integrated circuit used in the embodiment.

Thus an image of the electronic component 5 is captured with the recognition camera 16, the recognition processing is done by the image processing unit 18 to measure geometry of the component and measured size of the component is judged whether it is within the tolerance or not. In FIG. 10, dashed lines represent geometry of leads conforming the specification, while solid lines show geometry of leads to be explained here. When X-dimension of the component size measured by the image processing unit 18 is 12.5 mm and Y-dimension is 5.6 mm with downward bent, Y-dimension is out of tolerance, i.e., the Y-dimension is out of 6.0 mm ±0.3 mm as shown in FIG. 5. If the thickness by the result of the measurement based on the line sensor 27 is 2.2 mm, although it is within the tolerance (±0.2 mm) of the thickness of the component and judged normal, the component is judged abnormal due to lead shape failure, and gets abnormal processing.

And when the Y-dimension of the integrated circuit component measured by the recognition processing by the image processing unit 18 on the image of the electronic component 5 captured by the recognition camera 16 is 5.6 mm, if the thickness by the result of the measurement based on the line sensor 27 is 2.0 mm (no error), although the Y-dimension is out of the tolerance, the component is judged normal as it is within measurement tolerance of the lead edge, and gets normal processing.

That is, for a component which shows large variation in the result of measurement of Y-dimension due to the recognition of geometry of lead, such as an integrated circuit component having a thin lead edge, the CPU 31 judges it normal (because the lead edge is thin), when the measurement result of the thickness of the component is exactly equal to the component data, even when the difference in the Y-dimension is large and there is a measurement error of the lead edge. On the contrary, the CPU 31 judges it abnormal due to the lead geometry failure (downward bent, etc.), when the difference in the measurement result of both the thickness of the component and the Y-dimension is large.

Next case is for an electrolytic capacitor (refer to FIG. 11) having component data shown in FIG. 6. The lowest edge position, for example 9.9 mm, stored in the hold memory 39 based on the output of the line sensor is compared with the sum 9.5 mm of the thickness 4.5 mm and the nozzle level 5.0 mm, that is a bottom edge position of the suction nozzle 14, stored in the RAM 32. Since the difference 0.4 mm is within the tolerance (±0.4 mm) of the thickness, it is judged normal suction (normal posture) in a routine shown in FIG. 7, and the CPU 31 makes a normal processing control shown in FIG. 9.

Figure 11:
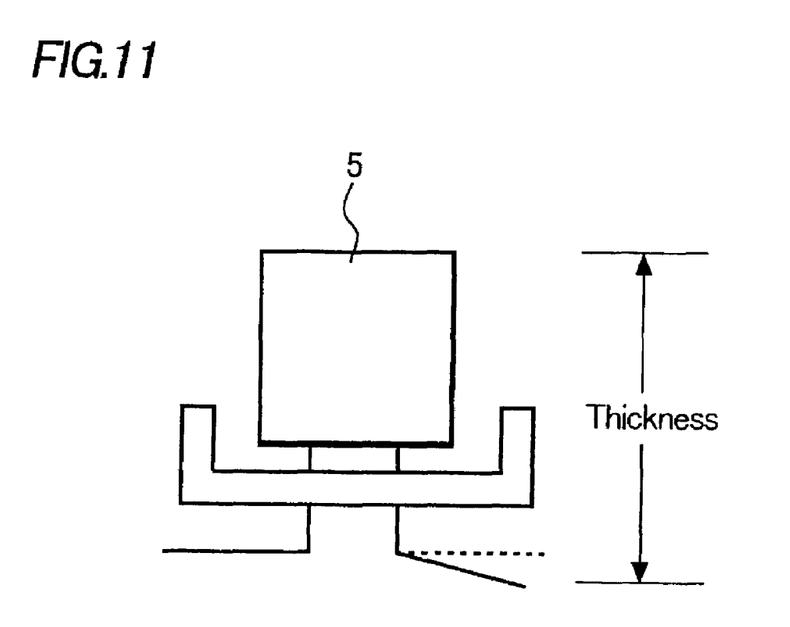
FIG. 11 is a side view of an electrolytic capacitor used in the embodiment.

Thus an image of the electronic component 5 is captured by with the recognition camera 16, the recognition processing is done by the image processing unit 18 to measure geometry of the component and measured size of the component is judged whether it is within the tolerance or not. When X-dimension and Y-dimension of the component size measured by the image processing unit 18 are within the tolerance but a lead length measured by the image processing unit is out of the tolerance, that is, if the lead length measures 1.7 mm with a downward bent of one of a pair of the leads as shown in FIG. 11, the component is judged abnormal component size because measured lead length is out of a range of 2.0 mm±0.2 mm. Therefore, although the thickness 4.9 mm by the result of the measurement based on the line sensor 27 is within the tolerance of the thickness, if a parallelism of a pair of the leads is +9 degree, the component is judged abnormal due to a twisted lead failure since the parallelism exceeds ±8 degree, although there is no parallelism as component data, according to the program stored in the ROM 33, and undergoes abnormal processing.

And when the X-dimension and the Y-dimension of the electrolytic capacitor measured by the recognition processing by the image processing unit 18 on the image of the electronic component 5 captured by the recognition camera 16 are within the tolerance, if the length of the lead is out of tolerance, the component is judged abnormal component size. If the thickness by the result of the measurement based on the line sensor 27 is 4.5 mm (no error), even if the parallelism of a pair of the leads is +9 degree (over ±8 degree), the component is judged normal as the thickness of the component is just as the specification and the parallelism is within processing tolerance of the lead, and undergoes normal processing.

As described above, the posture of the component 5 is judged each time the component 5 moves to a stop station, and when necessary, not only position recognition but also posture judgement is performed and an appropriate procedure is taken. The CPU 31 reads-in the output of the line sensor 27 just after the processing such as calculating the bottom edge and comparing the read-in memory 38 and this hold memory 39 in the embodiment. However it is possible prolonging the read-in intervals to execute other processing during free time. It is also possible disposing another processing unit consisting of the read-in memory and the hold memory connected with the CPU of the automatic electronic component mounting apparatus through the interface and connected with the line sensor on the other hand, so that the CPU of the mounting apparatus gives the signals to commence and terminate the detection, and judges whether the component is normal or abnormal as described before, after the CPU of the mounting apparatus reads-in the content of the hold memory after completion of the detection.

The line sensor 27 is disposed at the station where the rotary table 13 stops and detects the bottom edge of the component 5 before and after the stopping in the embodiment. The line sensor 27 can be disposed between the stations and the detection can be done while the component 5 is moving. Or the line sensor can move horizontally while the component 5 is stopping at a station. Instead of the rotary table, the mounting head can be disposed on the XY-table which moves to and gets the component from the supply stage and mounts the component on the predetermined position on the printed circuit board, and the line sensor can be disposed on the path of the mounting head.

The bottom edge position is calculated by summing up the data for the thickness of the component and the noise level stored in the RAM 32 in the embodiment. Instead, the data for the bottom edge position can be stored in the RAM 32.

As described above, this invention enables the decision of abnormal suction of a component even when the difference between the width and the height of the component is small.

As described above, this invention enables a reliable decision of abnormal suction posture of an electronic component even when the difference between the width and the height of the component is small, and can reduce the occurrence of substrate failures.

The above is a detailed description of a particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. An electronic component mounting apparatus picking up an electronic component with a suction nozzle, capturing an image of the electronic component held by the suction nozzle with a component recognition camera for a position recognition, adjusting a position of the electronic component held by the suction nozzle based on a result of the position recognition, and mounting the component on a printed circuit board, the apparatus comprising:

a detecting device detecting a thickness of the electronic component held by the suction nozzle based on an output from a sensor disposed along a path of the suction nozzle;

an image processing unit measuring at least a dimension of the electronic component based on the image captured by the component recognition camera; and a judging device judging whether a posture of the component held by the suction nozzle is normal or abnormal by comparing the dimension of the electronic component measured by the image processing unit with the thickness of the electronic component detected by the detecting device.

2. The electronic component mounting apparatus of claim 1, wherein the sensor comprises a plurality of light transmitters and a plurality of light receivers so configured that each of the light receivers receives light from a corresponding light transmitter.

3. The electronic component mounting apparatus of claim 1, wherein the dimension of the electronic component measured by the image processing unit is a lateral dimension of the electronic component.

\* \* \* \* \*

UNITED STATES PATENT AND TRADEMARK OFFICE
CERTIFICATE OF CORRECTION

PATENT NO. : 7,296,343 B2
APPLICATION NO. : 10/259783
DATED : November 20, 2007
INVENTOR(S) : Yoshinao Usui et al.

It is certified that error appears in the above-identified patent and that said Letters Patent is hereby corrected as shown below:

On the cover page, in item (73) Assignee:

Please replace "Sanyo Electric Co., Ltd., Osaka (JP)"
and

"Sanyo High Technology Co., Ltd., Gunma, (JP)"

With the following:

-- Hitachi High-Tech Instruments Company, Ltd., Gunma (JP) --.

Signed and Sealed this

Eighth Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 7,296,343 B2 Page 1 of 1
APPLICATION NO. : 10/259783
DATED : November 20, 2007
INVENTOR(S) : Yoshinao Usui et al.

It is certified that error appears in the above-identified patent and that said Letters Patent is hereby corrected as shown below:

On the cover page, in item (73) Assignee:

Please replace "Sanyo Electric Co., Ltd., Osaka (JP)"
                and

"Sanyo High Technology Co., Ltd., Gunma, (JP)"

With the following:

-- Hitachi High-Tech Instruments Company, Ltd., Gunma (JP) --.

Signed and Sealed this

Twenty-ninth Day of April, 2008

JON W. DUDAS
*Director of the United States Patent and Trademark Office*